(12) United States Patent
Miller et al.

(10) Patent No.: US 6,845,557 B2
(45) Date of Patent: Jan. 25, 2005

(54) METHOD FOR PRODUCING AN ELECTRONIC PACKAGE POSSESSING CONTROLLED IMPEDANCE CHARACTERISTICS

(75) Inventors: Thomas R. Miller, Endwell, NY (US);
William J. Rudik, Vestal, NY (US);
Robert J. Testa, Owega, NY (US);
Kevin P. Unger, Endwell, NY (US);
Michael Wozniak, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 237 days.

(21) Appl. No.: 10/225,862

(22) Filed: Aug. 22, 2002

(65) Prior Publication Data

US 2002/0189094 A1 Dec. 19, 2002

Related U.S. Application Data

(62) Division of application No. 09/495,628, filed on Feb. 1, 2000, now Pat. No. 6,469,256.

(51) Int. Cl.$^7$ ................................................ H01K 3/10
(52) U.S. Cl. .......................... 29/852; 29/846; 174/262; 174/263; 427/97; 427/99
(58) Field of Search ........... 29/846, 852; 174/262–266; 427/97, 99

(56) References Cited

U.S. PATENT DOCUMENTS

| 3,673,680 | A |   | 7/1972  | Tanaka et al. |
|-----------|---|---|---------|---------------|
| 4,610,756 | A |   | 9/1986  | Strobel |
| 4,661,654 | A |   | 4/1987  | Strobel |
| 4,783,815 | A | * | 11/1988 | Buttner ...................... 381/324 |
| 5,281,771 | A |   | 1/1994  | Swift et al. |
| 5,336,855 | A |   | 8/1994  | Kahlert et al. |
| 5,822,856 | A |   | 10/1998 | Bhatt et al. |
| 6,618,940 | B2 | * | 9/2003 | Lubert et al. .................. 29/846 |

* cited by examiner

Primary Examiner—Richard Chang
(74) Attorney, Agent, or Firm—Scully, Scott, Murphy & Presser; William H. Steinberg

(57) ABSTRACT

A method for creating an impedance controlled printing wiring board, particularly the formation of a structure for high speed printed wiring boards incorporating multiple differential impedance controlled layers. Furthermore, disclosed is the provision of a method for producing an impedance controlled printed circuit wiring board. Also, there is the provision of a method for producing high speed printed wiring boards with multiple differential impedance controlled layers.

5 Claims, 3 Drawing Sheets

METHOD FOR PRODUCING AN ELECTRONIC PACKAGE POSSESSING CONTROLLED IMPEDANCE CHARACTERISTICS

CROSS REFERENCE TO RELATED APPLICATION

The present application is a divisional of U.S. patent application Ser. No. 09/495,628 filed on Feb. 1, 2000, now U.S. Pat. No. 6,469,256.

BACKGROUND OF THE INVENTION

1. Field of the Invention

The present invention relates to a method for creating an impedance controlled printed wiring board. More particularly, the invention is directed to the formation of a structure for high speed printed wiring boards incorporating multiple differential impedance controlled layers. Furthermore, the invention is also directed to the provision of a method for producing an impedance controlled printed circuit wiring board. Moreover, the invention is further directed to the provision of a method for producing high speed printed wiring boards with multiple differential impedance controlled layers.

In essence, problems are encountered in the technology with regard to the production of printed wiring boards and which incorporate so-called deep blind vias while maintaining tight and stringent impedance control.

Presently, printed-wiring board (PWB) products which are intended for high frequency applications are provided with plated through holes (PTH's) extending through the thickness of the board thickness, and resultingly creating an antenna which can adversely affect signal integrity. Thus, by terminating the plated through holes at specific layers within the printed wiring board, the undesired antenna effect is substantially reduced or possibly even completely eliminated.

Basically, high frequency printed wiring boards necessitate an extremely tight control over impedance, such as along differential depths, board edges and alike, in order to maintain high levels of signal integrity. Consequently, in the construction of multi-layer printed wiring boards, the copper plating thicknesses which are provided on the various board innerlayers as well as the innerlayer spacings must be tightly and precisely controlled. However, inasmuch as the innerlayers are actually substructures containing plated through holes (PTH's) the surface copper thickness on the substructures may quite possibly exceed the thickness required for impedance control; in effect, the thickness comprised of the base foil plus the plated copper. This necessitates that the copper surface must be thinned down without etching the plating in the holes.

2. Discussion of the Prior Art

Although various types of multilayer and single-layer structures for printed wiring boards (PWB) and printed circuit boards (PCB) have been developed in the technology, none of these address themselves directly to solving the problem associated with the providing of tightly controlled impedances through structures and methods which will facilitate attainment of satisfactory levels of signal integrity.

Bhatt et al. U.S. Pat. No. 5,822,856 describes a process for the hole filling of a plated through hole (PTH) for a single-layer circuit board. There is no discussion of any copper thinning, varying copper thicknesses or providing for impedance control in order to eliminate problem which are encountered with regard to adverse effects on signal integrity.

Kahlert et al. U.S. Pat. No. 5,336,855 relates to a multi-layer printed circuit board which is employed for high-frequency operation and wherein the characteristic impedance is controlled through the creation of isolated metal islands which are connected to ground. The metallization layers in the structure of this patent are of equal thickness and there is no disclosure of varying copper thicknesses on different board layers and wherein there is no plated through hole fill material provided in the structure.

Swift et al. U.S. Pat. No. 5,281,771 pertains to a multi-layer wiring board with interlevel connectors, and to a method for producing the structure which provides for carbon fibers in order to form electrical interconnects between the layers. There is no discussion nor suggestion of utilizing the thinning of copper deposits on innerlayers of printed wiring board in order to provide for impedance control allowing for improved levels of signal integrity.

Strobel U.S. Pat. Nos. 4,661,654 and 4,610,756 each disclose printed circuit boards and manufacturing processes which do not direct themselves to reduction of plated copper layers or using a plated hole fill other than a hole filled with solder for pin insertion. Consequently, there is no suggestion nor disclosure of providing an impedance control so to resultingly improve signal integrity in a manner analogous with that disclosed by the present invention.

Tanaka et al, U.S. Pat. No. 3,673,680 discloses a method of fabricating printed wiring boards wherein a relatively heavy solder layer is provided at locations at which electrical and mechanical connections are required. There is no discussion nor disclosure of any multilayer substrate or of reducing the thickness of plated copper layers and of using a plated through hole fill other than having a hole filled with a solder to facilitate pin insertion.

As described in the publication "Innovations in Base Materials and Polymer Applications", European Institute of Printed Circuits, 1994, this article merely discloses the impact on process yields of using a positive working ED resist so as to provide improved conductive contrast, resolution and conductive geometry in the construction of printed circuit boards. There is no discussion of any reducing copper layer thicknesses in a manner so as to control impedance of printed wiring boards which would effect signal integrity.

Finally, the article "High Density MLB's With New Materials and Build-up Technologies", Printed Circuit World Convention VII Proceedings of May 1996 describe the utilization of new materials and the forming of multi-layer laminates so as to provide improved innerlayer structures and buried via holes or blind via holes to resultingly improve higher density as well as higher accuracy in the electronic equipment and to also provide an environmentally-friendly enhanced printed circuit boards. There is no disclosure of utilizing the inventive aspect of thinning copper layers in a multilayer printed wiring board structure with the aspect of multiple differential impedance control layers.

SUMMARY OF THE INVENTION

Accordingly, in order to impart an improvement to the currently available technology with regard to the provision of a method and resulting structure for creating an impedance-controlled printed wiring board, particularly such as a multilayered printed wiring board, the present invention is directed to the aspect of creating substructures which are laminated in order to produce an overall printed wiring board, structure wherein there is provided a control over the impedance on the innerlayers when aspects such as deep lined or deep varied vias are required or innerlayer or external surfaces are required to be of different thicknesses. In order to attain that effect, i.e. impedance control, the invention involves the formation of a printed wiring board (PWB) substructure containing plated through holes (PHT's) which are then filled in with the copper surface being thinned to the appropriate thickness required for the innerlayer control. The overall structure can then contain filled plated through holes (PTH's) with an overall copper thinning for external circuitization control. The inner layers being actually substructures containing plated though holes, the surface copper thickness and the substructures may exceed that required for impedance control, such as the base foil thickness plus that of the plated copper; when the copper surface is thinned down without etching the copper plating in the holes.

Furthermore, pursuant to the invention, advantage is taken of the uses of currently employed technology in order to produce a high speed edge coupled and broadside differently controlled multi-layer printed wiring board arrangement allowing for multiple layer to layer (broadside) and common layer (edge coupled) differential wiring pairs to exist independently in one high speed application, for example >1 GHz.

For instance, the application of the inventively produced structure of the printed wiring board with an IBM BT resin allows for a low loss, high speed printed wiring board utilization with excellent wiring density and signal integrity capabilities. The concept pertaining to the use of deep blind interconnect layering facilitates solutions to technical manufacturing problem in plating aspect ratio difficulties by allowing for the plating and controlled copper finishing on independently fabricated subcomposite structures, which are then combined through lamination into one contiguous printed wiring board structure with highly reproducible or controllable dielectric thickness and copper feature attributes. This processing control is vital in order to achieve the proper signal integrity which is required in order to meet high speed printed wiring board applications which are currently being developed and contemplated for future applications in the technology and industry.

Pursuant to the invention, by utilizing varying dielectric thicknesses or substrates in combination with controlled copper deposition and surface treatment to achieve the proper combination of thickness, spacing, copper line width thickness and all inner and outer layers, there is developed a structure which will simultaneously apply various types of impedance controlled innerlayers on a printed wiring board. The resulting structure thus utilizes a unique combination of existing and modified manufacturing processes in order to achieve the proper attributes, wherein lamination hole fill, deep blind vias, subcomposite structures and controlled fluid head copper etch, such as through chemical polishing, may comprise key elements allowing for the economical manufacture of the printed wiring board.

Accordingly, it is a primary object of the present invention to provide a novel method for producing a printed wiring board structure which incorporates an improved impedance control.

Another object of the present invention resides in the provision of a method for producing a multilayered printed wiring board utilizing copper thinning between innerlayers and plated through holes (PTH's) which are filled so as to provide for variably controlled impedances adapted to affect signal integrity in order to regulate the latter within specified parameters.

Still another object resides in the provision of a structure for a printed wiring board which utilizing novel copper thinning technology for controlling impedance and resultingly signal integrity.

Yet another object of the present invention is to provide a multilayer printed wiring board including copper thinning and variable layer and copper plating thicknesses, and with plated through holes which are provided with a fill so as to control impedance and resultingly signal integrity.

BRIEF DESCRIPTION OF THE DRAWINGS

A reference may now be had to the following detailed description of a preferred embodiment of the invention taken into conjunction with the accompanying drawings; in which.

DETAILED DESCRIPTION OF PREFERRED EMBODIMENT

Figure 1:
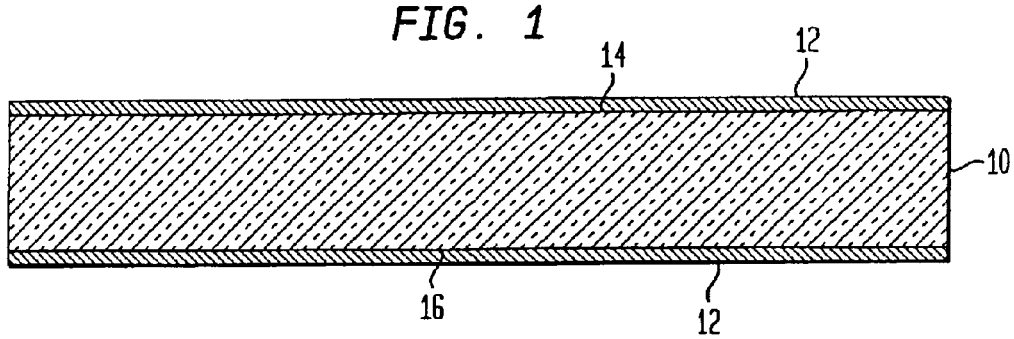
FIG. 1 generally diagrammatically illustrates a substrate layer for a printed wiring board with applied copper foil.

Referring in more specific detail to the drawings, and in particular, FIG. 1 illustrates a section of a dielectric substrate 10 for a printed wiring board having a thickness of copper foil material 12 applied on both sides or surfaces 14, 16 thereof, in an initial step of producing the impedance controlled printed wiring board structure. Although two conductive layers and one dielectric layer are shown for base member 10, it is understood that the invention is not limited thereto. Specifically, it is only necessary to provide one such conductive layer and one such dielectric layer while still attaining the advantageous results taught herein. At least two layers of each are used when it is desired to incorporate an internal conductive plane (e.g., power, ground or signal) as part of the final structure. Understandably, several conductive dielectric layers and corresponding internal conductive planes may be utilized, depending on operational requirements for the finished product. Subsequently, a base member represented here could be fabricated from conductive layers that do not require personalization.

Figure 2:
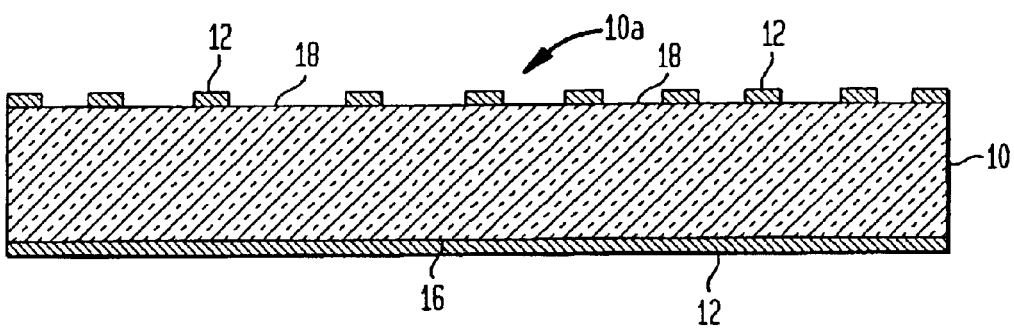
FIG. 2 illustrates the substrate layer and copper foil of FIG. 1 shown personalized by being etched on one side thereof.

As shown in FIG. 2, one side 10a of the dielectric substrate 10 is personalized by etching portions 18 of the copper foil 12 so as to provide a wiring pattern (not shown) as may be required by specific intended physical applications for the printed wiring board.

Figure 3:
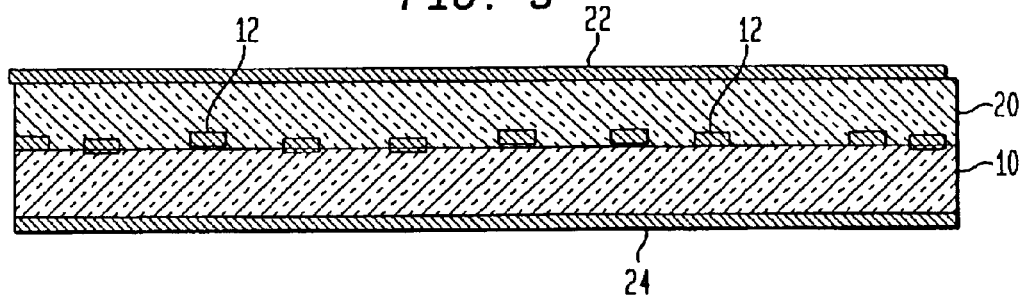
FIG. 3 illustrates a second layer of the substrate superimposed on the previous layer with the personalized located layers is internal by and both outer surfaces being thinned by etching.

Pursuant to FIG. 3, representative of a subsequent step of the inventive method, a second layer 20 of a substrate consisting of a dielectric material is laminated to the first substrate layer 10, such that the personalized layer of the etched copper foil 12 is now positioned internally by between the two dielectric substrate layers 10, 20. Both sides 22, 24 or external surfaces of the laminated substrate layers 10, 20 have the copper surfaces then etched so as to be thinned; for example, to about 5 to 7 microns, as may be required.

Figure 4:
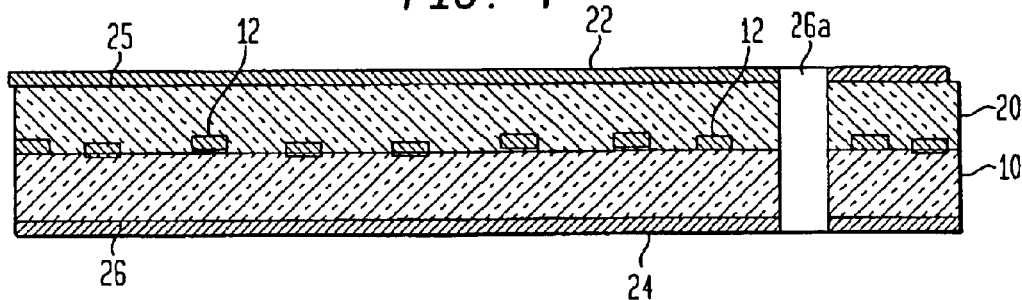
FIG. 4 illustrates the laminated structure of FIG. 3 being provided with at least one drill hole.

Thereafter, as shown in FIG. 4, drilled holes 26a, of which one is illustrated are then formed so as to extend through the laminated substrates 10, 20 and the copper layers or foils 25, 26 located on both of the external surfaces. Although only one opening is shown formed in the substrate, it is understood that multiple openings may be formed depending on the ultimate electrical requirements of the circuitized substrate.

Figure 5:
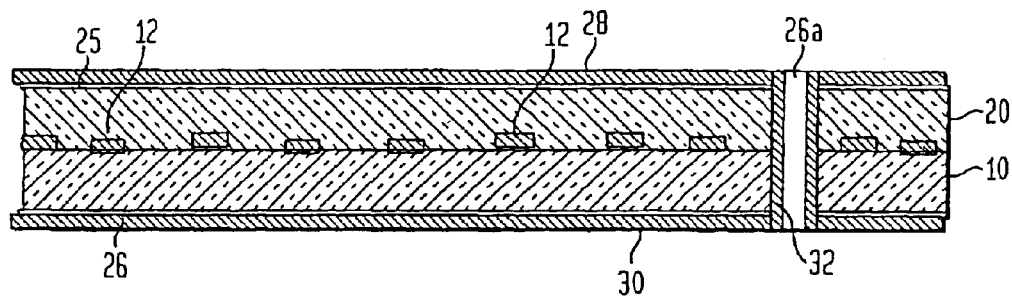
FIG. 5 illustrates copper plate surface and plated through holes (PHT's) applied to the laminated structure of FIG. 4.

As illustrated in FIG. 5, the drilled holes 26a, of which one is shown, and the outer surfaces of the laminated structure are copper plated so as to provide copper plate surfaces 28, 30 and plated through holes (PTH's) 32.

Figure 6:
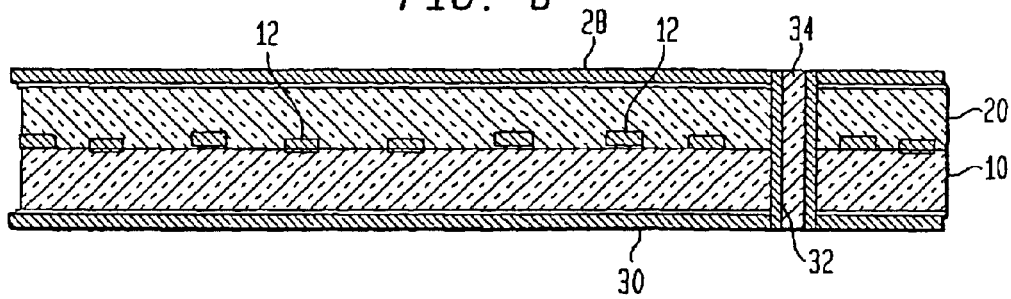
FIG. 6 illustrates the fill plated holes of the laminated structure of FIG. 5.
Figure 7:
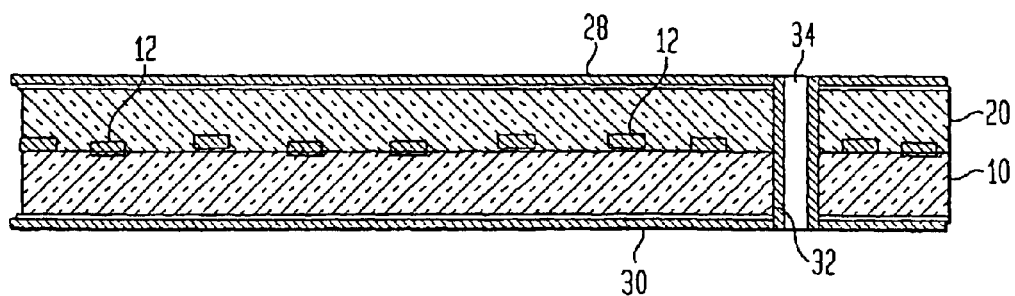
FIG. 7 illustrates the thinned surface copper to required thickness for impedance control, the plated through holes being protected from etching by the fill contained therein.

Thereafter, as shown in FIG. 6, the plated through holes (PTH's) are then filled with a suitable dielectric material or solder 34 as may be required, and as shown in FIG. 7, both external surfaces 28, 30 of the laminated substrates 10, 20 are thinned to the desired thickness so as to provide for the necessary intended impedance control, with holes projecting from the etching surfaces because of the fill provided in the plated through holes.

Figure 8:
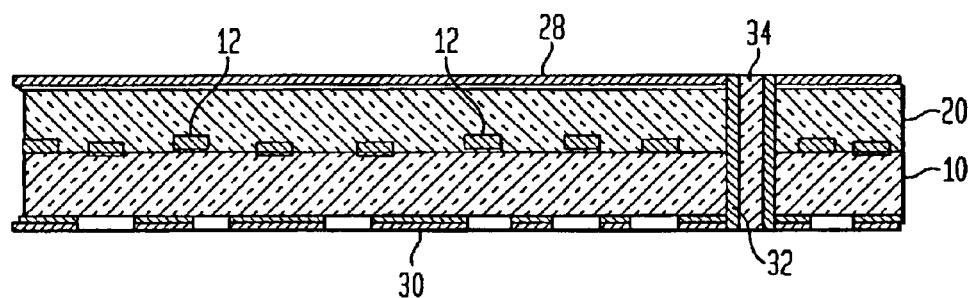
FIG. 8 illustrates one side, such as of the interior surface, being personalized by etching.

FIG. 8 illustrates the entire formed structure with one side of the interior surface personalized so as to provide a building block for producing a final multilayer printed wiring board arrangement.

Figure 9:
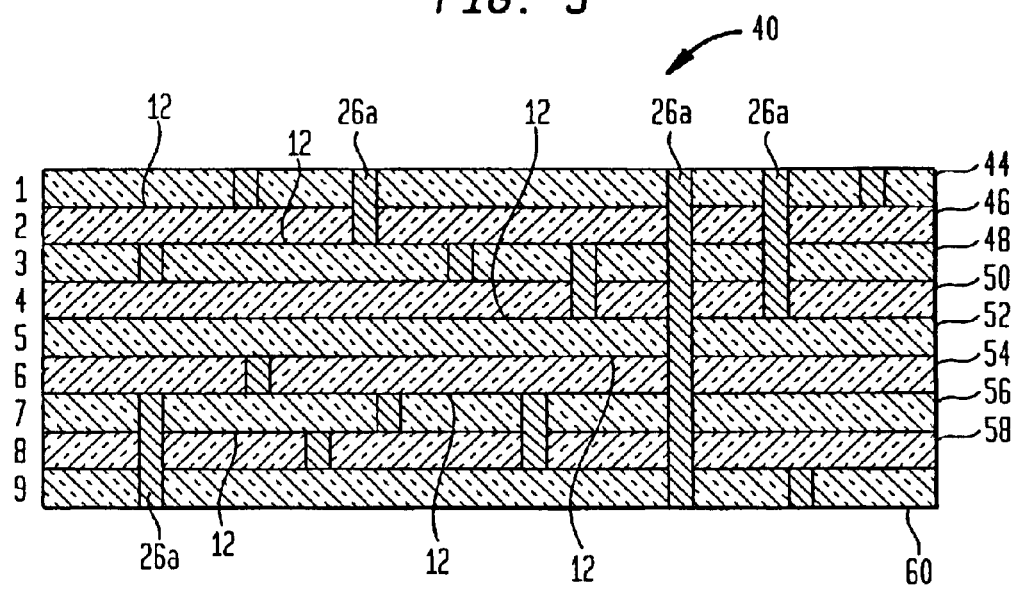
FIG. 9 illustrates a multilayer printed wiring board (PWB) combination showing the laminated structure produced in accordance with the novel method.

The final multilayer printed wiring board 40 (PWB) is represented in FIG. 9 of the drawings illustrating a combination of building blocks similar to that of FIG. 8, in this instance showing nine layers of various customized building blocks, although any number as necessary can be utilized, which when laminated form the multilayer printed circuit board arrangement 40. As illustrated in the drawing, the vertical rectangles represent a "deep blind" or "deep buried" vias 42 which, are provided with PTH fill therein. Moreover, the structure may be provided with one or more plated through holes (PTH's) extending through the entire thickness or depth of the dielectric layers 44 through 60, which can be either filled or unfilled or there can be provided a building block without any vias. It is understood that the structure in FIG. 9 is not solely constructed of elements described in FIG. 8. Structures as shown in FIG. 2 can be incorporated into the structure especially where the vias need to end within the main structure. It is further understood that the structures shown in FIG. 3 can be single sided personalized as that of FIG. 2 and built up as many times as needed prior to the processing steps of the drilled via formation and subsequent holefilling and thinning.

With regard to the foregoing, the novelty resides in that the structure has the copper surface on each of the building blocks imparted a different thickness as may be required for impedance control so as resultingly afford an advantageous and satisfactory signal integrity, and by terminating the PTH's at specific layers this reduces the or even eliminates the antenna effect.

As shown in the following table, regarding possible high speed wiring board applications with improved wiring density and signal integrity capability there is a numerical representation of the values of a deep blind via subcomposite structure in eight planes of the laminated building blocks.

From the foregoing, it becomes readily apparent that the inventive method and resulting structure, in a simple and expedient manner, provides for an improved controlled impedance so as to thereby improve upon the signal integrity and enables an increased wiring density.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method for producing an electronic package possessing controlled impedance characteristics, said method comprising the steps of:

providing a first substrate consisting of a dielectric material; applying a first conductive layer on at least one surface of said substrate, said first conductive layer having a first thickness;

plating a second conductive layer on said first conductive layer, said second conductive layer having a thickness greater than the thickness of said first conductive layer;

reducing the thickness of said second conductive layer to form a thickness which in combination with the first thickness of said first conductive layer is less than the initial thickness of said second conductive layer; laminating a second dielectric substrate to said first substrate so as to cause said conductive layers to comprise an innerlayer intermediate said laminated substrate;

drilling holes into said laminate substrate, and plated conductive material in said holes, said holes comprising selectively plated through holes, deep blind holes and buried holes forming vias in said laminated substrates; and filling at least some of said holes with a dielectric material or solder to prevent thinning of the plated conductive material in said holes during external etching and thinning of conductive material on external surfaces of said laminated substrates.

2. A method for producing an electronic package as claimed in claim 1, wherein the external surfaces of said laminated substrates are each provided with conductive layers, and etching said external conductive layers to predetermined thicknesses.

3. A method for producing an electronic package as claimed in claim 2, wherein at least one external surface of said conductive layers on said substrate is etched to form a personalized printed wiring pattern.

4. A method for producing an electronic package as claimed in claim 2, wherein a plurality of said laminated substrates are combined to form a multilayer electronic package.

5. A method for producing an electronic package as claimed in claim 1, wherein said electronic package comprises a printed wiring board.

* * * * *